United States Patent [19]

Watkins et al.

[11] 4,433,749

[45] Feb. 28, 1984

[54] ACOUSTIC REAR RADIATION ABSORPTION FOR LOUDSPEAKER SYSTEMS

[76] Inventors: William H. Watkins; William D. Watkins, both of 1244 Caribbean Dr., Kingsport, Tenn. 37660

[21] Appl. No.: 350,183

[22] Filed: Feb. 19, 1982

[51] Int. Cl.[3] .............................................. H05K 5/00

[52] U.S. Cl. .................................... 181/151; 181/199; 181/DIG. 1

[58] Field of Search .......... 181/146, 151, 199, DIG. 1

[56] References Cited

U.S. PATENT DOCUMENTS 4,167,985 9/1979 Dunlavy ......................... 181/151 X

*Primary Examiner*—Benjamin R. Fuller

*Attorney, Agent, or Firm*—Larson and Taylor

[57] ABSTRACT

A loudspeaker system is provided wherein sound absorptive foam material is affixed to the sides of the loudspeaker cabinet so as to absorb that portion of the sound radiated from the loudspeaker that is directed towards the rear of the loudspeaker system, thereby serving in eliminating sound reflections from the walls of the room. This results in an overall system which can more accurately reproduce the recording site ambience inherent in a recording and which permits more accurate and natural imaging, i.e., more precise localization of voice and instrument placement within the soundfield of a pair of stereo loudspeakers.

3 Claims, 1 Drawing Figure

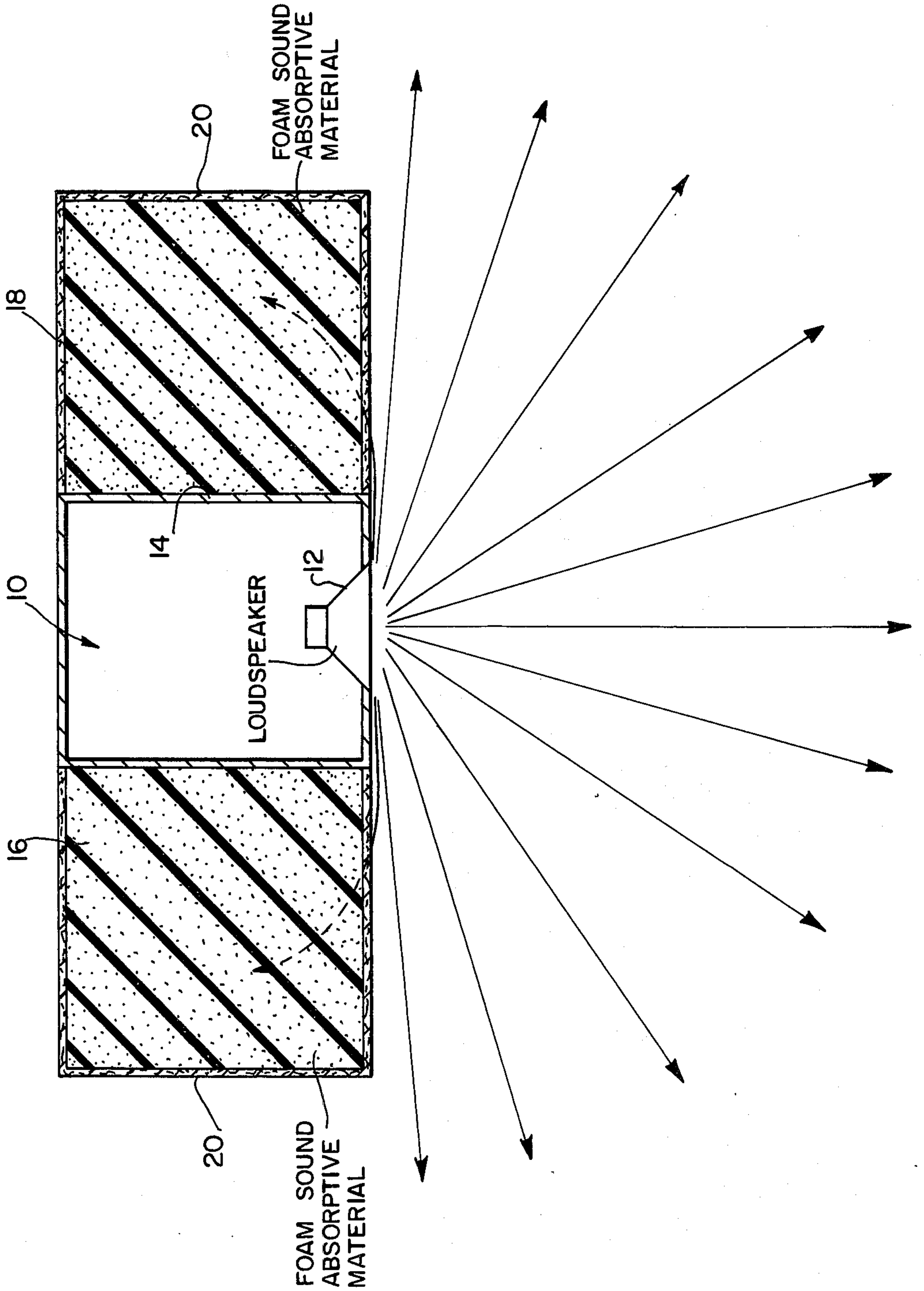
20
FOAM SOUND ABSORPTIVE MATERIAL
18
14
10
12
LOUDSPEAKER
16
20
FOAM SOUND ABSORPTIVE MATERIAL

ACOUSTIC REAR RADIATION ABSORPTION FOR LOUDSPEAKER SYSTEMS

FIELD OF THE INVENTION

The present invention relates to loudspeaker systems, and more particularly, to an improvement which allows a loudspeaker system to more accurately reproduce the recording site ambience inherent in a recording and which also allows more accurate and natural imaging, i.e., more exact localization of voice and instrumental placement within the soundfield of a pair of stereo loudspeakers.

BACKGROUND OF THE INVENTION

One of the desirable characteristics of a modern state of the art stereo system is the ability to create a sense of the listener being at the actual musical performance. A major factor in this is the degree to which the amience, i.e., the natural reverberation or echos of the recording hall where the music was played and recorded, can be heard. It is obvious that it would be desirable to eliminate the reflections produced within the listener's room, as such reflections mix with and confuse those in the recording. These listening room reflections reach the listener from a different direction than the direct sound from a loudspeaker, and thus, they also confuse the image placement in the soundfield. Many listeners, and advanced hi fi buffs in particular, have installed sound absorptive damping foam, made specifically for this purpose, on their listening room walls to eliminate reflections and achieve more natural sound. As is discussed in more detail below, the present invention uses foam or other acoustic absorptive material directly as an integral part of the loudspeaker system to acieve this purpose even more effectively.

It is important to distinguish the present invention from prior art loudspeaker systems wherein sound damping foam or the like is located within the speaker housing. Examples of such systems are disclosed, for instance in U.S. Pat. Nos. 4,161,995 (Pohlmann et al); 4,881,850 (Bonn); 3,512,605 (McCorkel); 3,720,285 (Russell et al) 4,286,688 (O'Malley); 3,944,020 (Brown); 3,982,607 (Evans); and 4,051,689 (Stallings, Jr.). Systems of this type are designed to absorb sound produced within the loudspeaker housing and obviously do not have any effect on sound coming from the front of the speaker, and clearly do not provide the advantages of the present invention discussed above, and below.

SUMMARY OF THE INVENTION

Because, as discussed above, the greatest problems occurs from the sound reflecting off the wall behind the loudspeaker, the present invention is concerned with preventing any significant amount of sound from radiating to the rear of the loudspeaker in the first place. In this regard, tests have shown that stoping the problem at the source, rather than trying to prevent the reflections after the sound hits the wall is much more effective and requires much less absorptive material.

Generally speaking, the invention involves mounting or supporting sound absorptive damping material directly on the loudspeaker housing or cabinet so as to absorb the rearwardly directed sound waves. In a specific preferred embodiment, sound absorbent foam material is mounted on both sides of the loudspeaker housing. This sound absorbing material serves to absorb the sound radiating in the rear 180 degrees of the loudspeaker radiating angle, i.e., the rear half, so that this sound never reaches the rear wall, and the rear wall reflection problem is effectively eliminated. It is important to note that the purpose of this foam absorptive material is to eliminate the above noted problems and not to prevent loudspeaker cabinet reflections themselves, which can be eliminated with thin foam covering on the front of the loudspeaker cabinet.

Other features and advantages of the invention are set forth in or will be apparent from the description of a preferred embodiment below.

BRIEF DESCRIPTION OF THE DRAWINGS

The single FIGURE in the drawing is a schematic plan view of a loudspeaker system incorporating sound absorptive foam material, in accordance with the present invention.

DESCRIPTION OF A PREFERRED EMBODIMENT

Referring to the drawing, a conventional loudspeaker system is indicated at 10 which basically comprises a loudspeaker 12 and a cabinet or housing 14. As indicated, sound radiates 360 degrees from central loudspeaker 12 and to absorb rearward sound, i.e., sound transmitted to the rear 180°, the loudspeaker system 10 is flanked by sound absorptive foam material blocks 16 and 18 located on both sides thereof. In an exemplary embodiment, the size of each foam block 16 and 18 is 48" tall, 10" thick, and 12" wide. As illustrated in the drawings, the size of each foam block is shown to be on the order of the size of the housing 14. The blocks 16, 18 are attached to the sides of the cabinet loudspeaker 14, and a top and bottom extend to the edge of the foam. For the sake of appearance, the entire assembly is covered with an acoustically transparent grill cloth 20.

As can be seen from the plan view shown in the drawings, the sound radiating to the rear is absorbed in the foam 16, 18 thus preventing reflection from the wall behind the loudspeaker system 10. This eliminates to a large extent, the listening room reflections, and allows the listener to better hear the natural recording site reflections and ambience inherent in the music, thereby resulting in more natural music reproduction. Further, as stated, the elimination of such reflections improves image location and resolution of the musical detail.

Although the invention has been described relative to an exemplary embodiment thereof, it will be understood that variations and modifications can be effected in this exemplary embodiment without departing from the scope and spirit of the invention.

We claim:

1. In a loudspeaker system including a loudspeaker located within a housing, the improvement comprising sound absorbing means, comprising sound absorptive damping material supported directly on the outside of the loudspeaker housing and extending outwardly a substantial distance from both sides thereof, for absorbing sound coming from the front of the loudspeaker which travels from the loudspeaker in direction towards the rear of the loudspeaker system so as to prevent this sound from being reflected from a wall located behind the loudspeaker system, thereby permitting the loudspeaker system to more accurately reproduce the recording site ambience inherent in a recording played by the system and to permit more accurate and natural imaging, the lateral extent of the sound absorptive material on both sides of the housing being on at least the order of the width of the housing such as to provide absorption of substantially all of the sound from the loudspeaker which travels in direction towards the rear of the loundspeaker system.

2. A loudspeaker system as claimed in claim 1 wherein said sound absorptive damping material is composed of a pair of blocks of said damping material disposed on the sidewalls of the loudspeaker housing.

3. A loudspeaker system as claim in claim 2 wherein said damping material comprises a sound damping foam.

* * * * *